(12) United States Patent
Shrier et al.

(10) Patent No.: US 6,172,590 B1
(45) Date of Patent: Jan. 9, 2001

(54) OVER-VOLTAGE PROTECTION DEVICE AND METHOD FOR MAKING SAME

(75) Inventors: Karen P. Shrier, Morgan Hill; Gerald R. Behling, San Jose; James B. Intrater, Santa Clara, all of CA (US); Mike Olla, Austin, TX (US); Jimmie D. Felps, Colorado Springs, CO (US); Kailash C. Joshi, Milpitas, CA (US)

(73) Assignee: SurgX Corporation, Fremont, CA (US)

(*) Notice: Under 35 U.S.C. 154(b), the term of this patent shall be extended for 0 days.

(21) Appl. No.: 08/941,917

(22) Filed: Oct. 1, 1997

Related U.S. Application Data

(63) Continuation of application No. 08/785,309, filed on Jan. 21, 1997, now abandoned, which is a continuation of application No. 08/589,355, filed on Jan. 22, 1996.
(60) Provisional application No. 60/034,839, filed on Jan. 7, 1997.

(51) Int. Cl.[7] .................................................. H01C 7/10
(52) U.S. Cl. .......................... 338/20; 338/21; 439/86; 361/111
(58) Field of Search .................. 361/111, 91.1; 257/355; 338/20, 21, 309; 439/86, 90, 91

(56) References Cited

U.S. PATENT DOCUMENTS

| | | |
|---|---|---|
| 3,648,364 | 3/1972 | Endo . |
| 3,676,742 | 7/1972 | Russell et al. . |
| 4,045,712 * | 8/1977 | DeTommasi ................ 338/21 |
| 4,377,541 * | 3/1983 | Bobik ...................... 338/21 |
| 4,486,738 | 12/1984 | Sadlo et al. . |
| 4,729,752 | 3/1988 | Dawson, Jr. et al. . |
| 4,788,523 | 11/1988 | Robbins . |
| 4,819,047 | 4/1989 | Gilfeather et al. . |
| 4,945,395 | 7/1990 | Suehiro . |
| 5,099,380 | 3/1992 | Childers et al. . |
| 5,142,263 | 8/1992 | Childers et al. . |
| 5,183,698 | 2/1993 | Stephenson et al. . |
| 5,189,387 | 2/1993 | Childers et al. . |
| 5,194,010 | 3/1993 | Dambach et al. . |
| 5,197,891 | 3/1993 | Tanigawa et al. . |
| 5,216,404 | 6/1993 | Nagai et al. . |
| 5,246,388 | 9/1993 | Collins et al. . |
| 5,260,848 | 11/1993 | Childers . |
| 5,262,754 | 11/1993 | Collins . |
| 5,278,535 * | 1/1994 | Xu et al. .................. 338/21 |
| 5,294,374 | 3/1994 | Martinez et al. . |
| 5,301,084 | 4/1994 | Miller . |
| 5,340,641 | 8/1994 | Xu . |
| 5,342,220 | 8/1994 | Kodama . |
| 5,393,597 | 2/1995 | Childers et al. . |
| 5,436,183 | 7/1995 | Davis et al. . |
| 5,515,226 | 5/1996 | Tailliet . |
| 5,578,867 | 11/1996 | Argos, Jr. et al. . |
| 5,674,083 | 10/1997 | Whiteman, Jr. et al. . |
| 5,715,127 | 2/1998 | Yu . |
| 5,973,588 * | 10/1999 | Cowman et al. ............ 338/21 |

FOREIGN PATENT DOCUMENTS

| | | |
|---|---|---|
| 405036341 | 2/1993 | (JP) . |
| 405335115 * | 12/1993 | (JP) ...................... 338/20 |
| WO 96/02922 | 2/1996 | (WO) . |

* cited by examiner

Primary Examiner—Paula Bradley
Assistant Examiner—Katrina Davis
(74) Attorney, Agent, or Firm—Burns, Doane, Swecker & Mathis, LLP

(57) ABSTRACT

A mass-producible, cost-effective discrete electrical protection device utilizing a precision gap between two electrically conductive members attached to an electrically insulating substrate to provide over-voltage protection to an electrical device. In one aspect, the electrical protection device is a surface mountable device. In another aspect, the device has through-holes for accommodating leads on an electrical connector. Methods are provided also for making the electrical protection device.

34 Claims, 9 Drawing Sheets

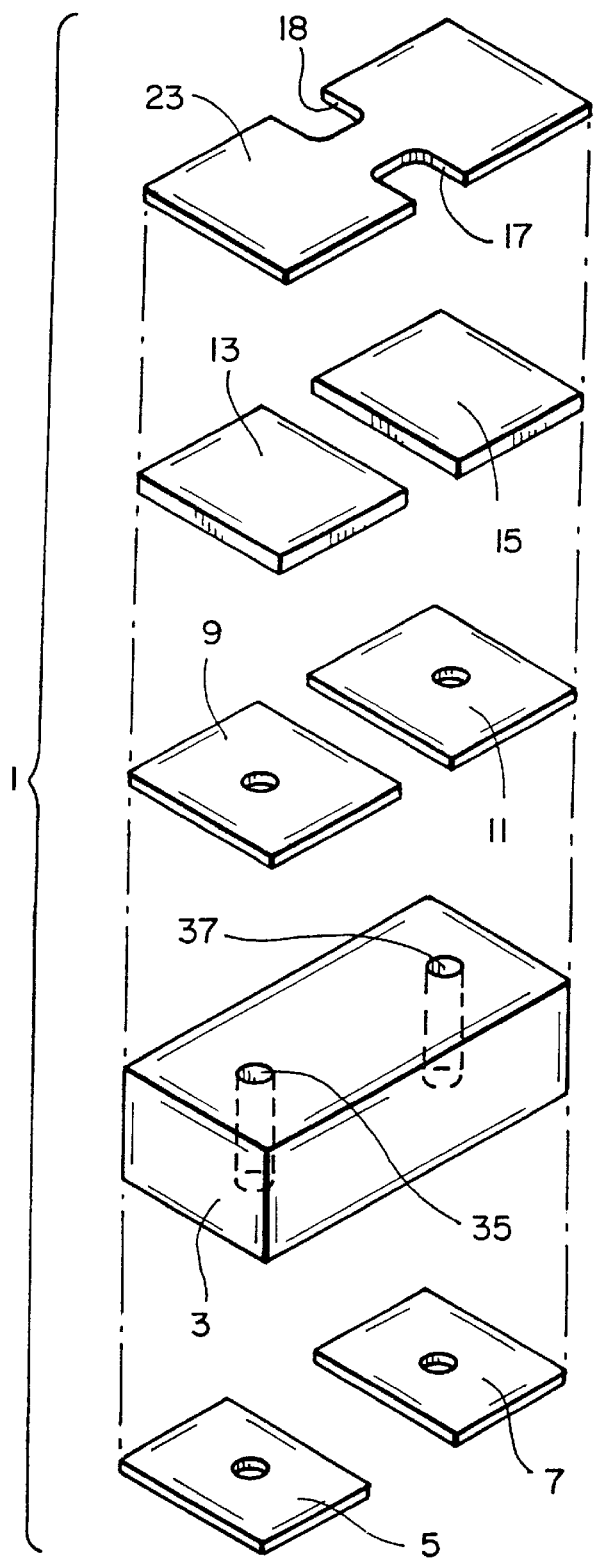
FIG_1

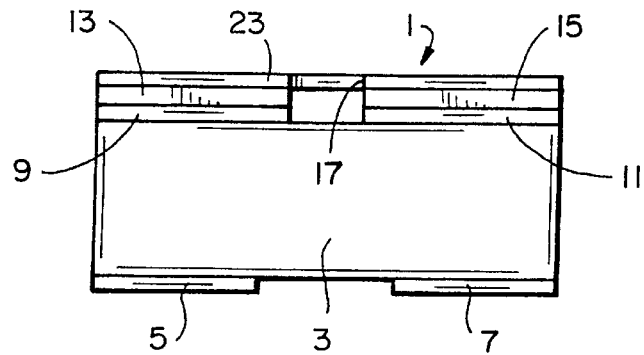
FIG_2
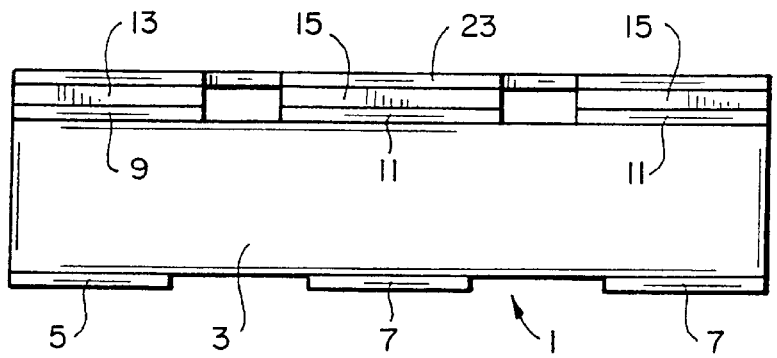
FIG_2A
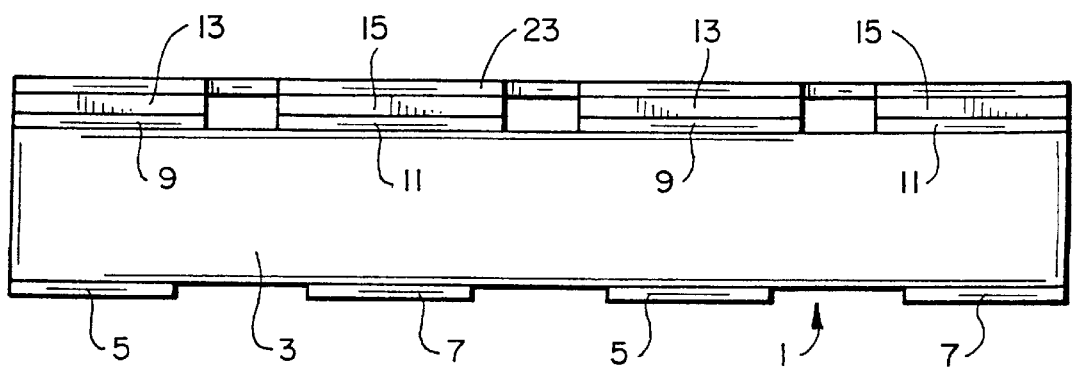
FIG_2B

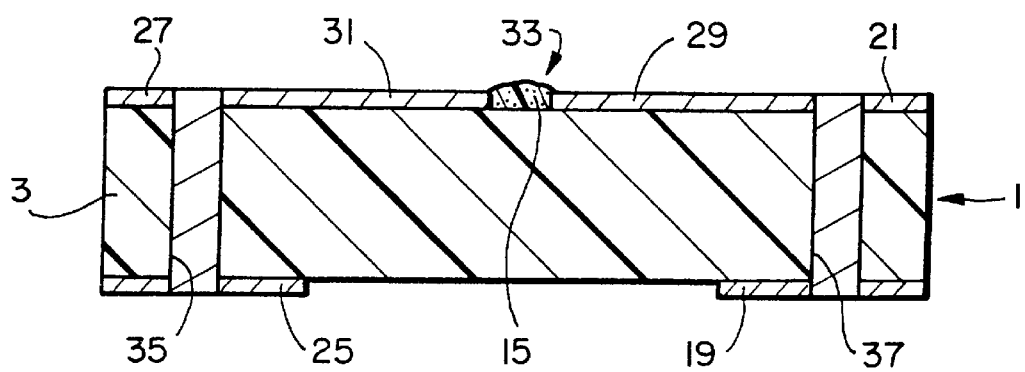
FIG_3
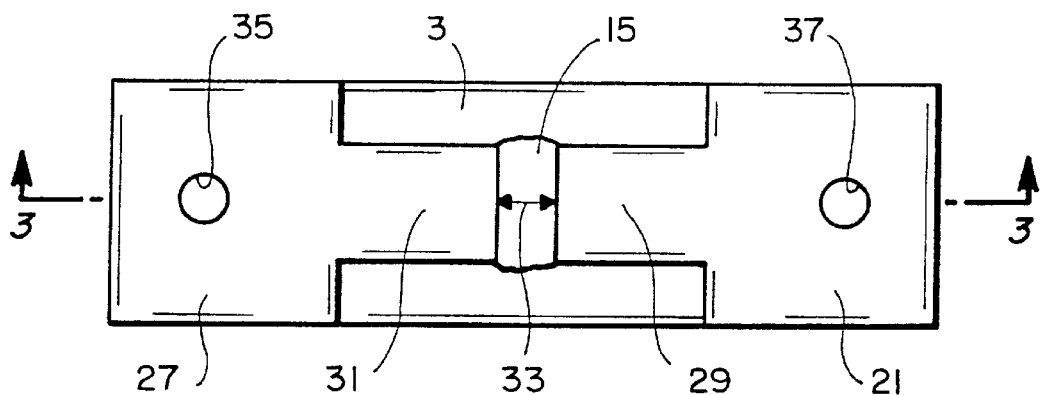
FIG_4
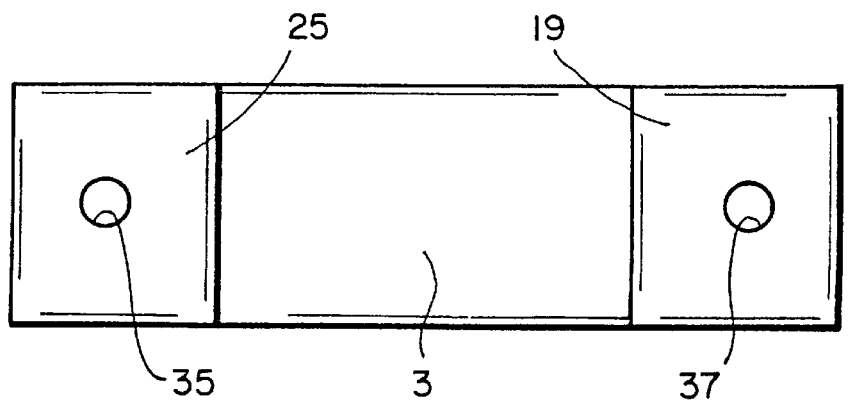
FIG_5

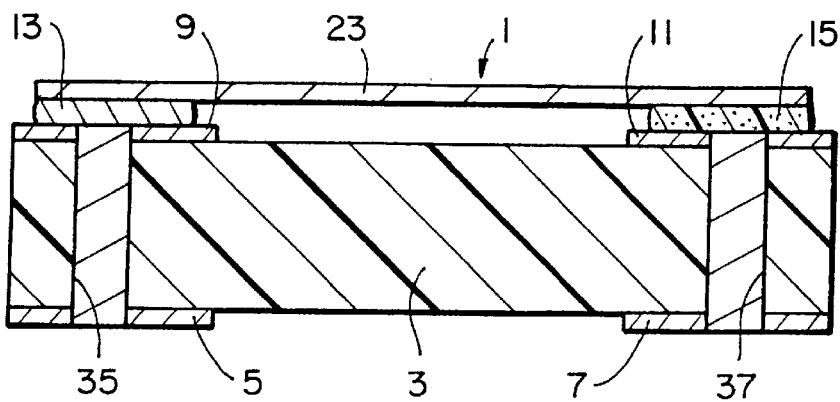
FIG_6
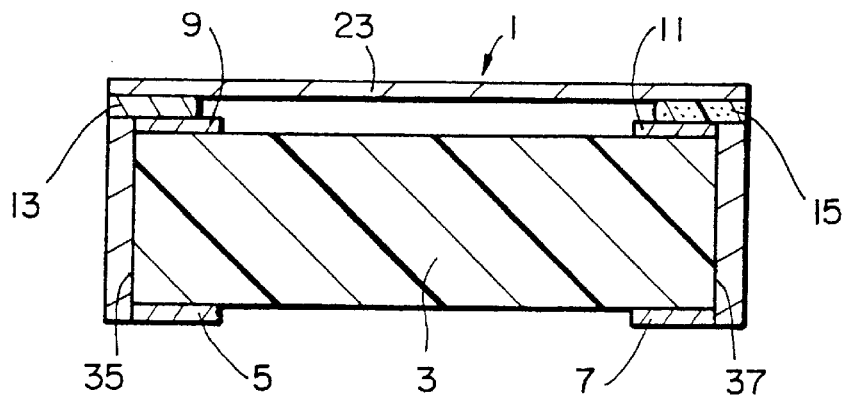
FIG_6A
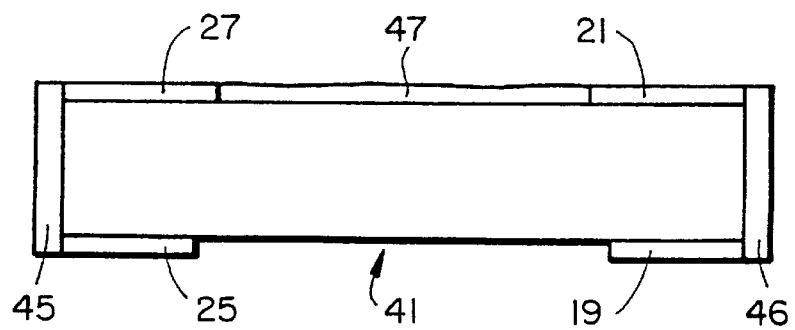
FIG_7

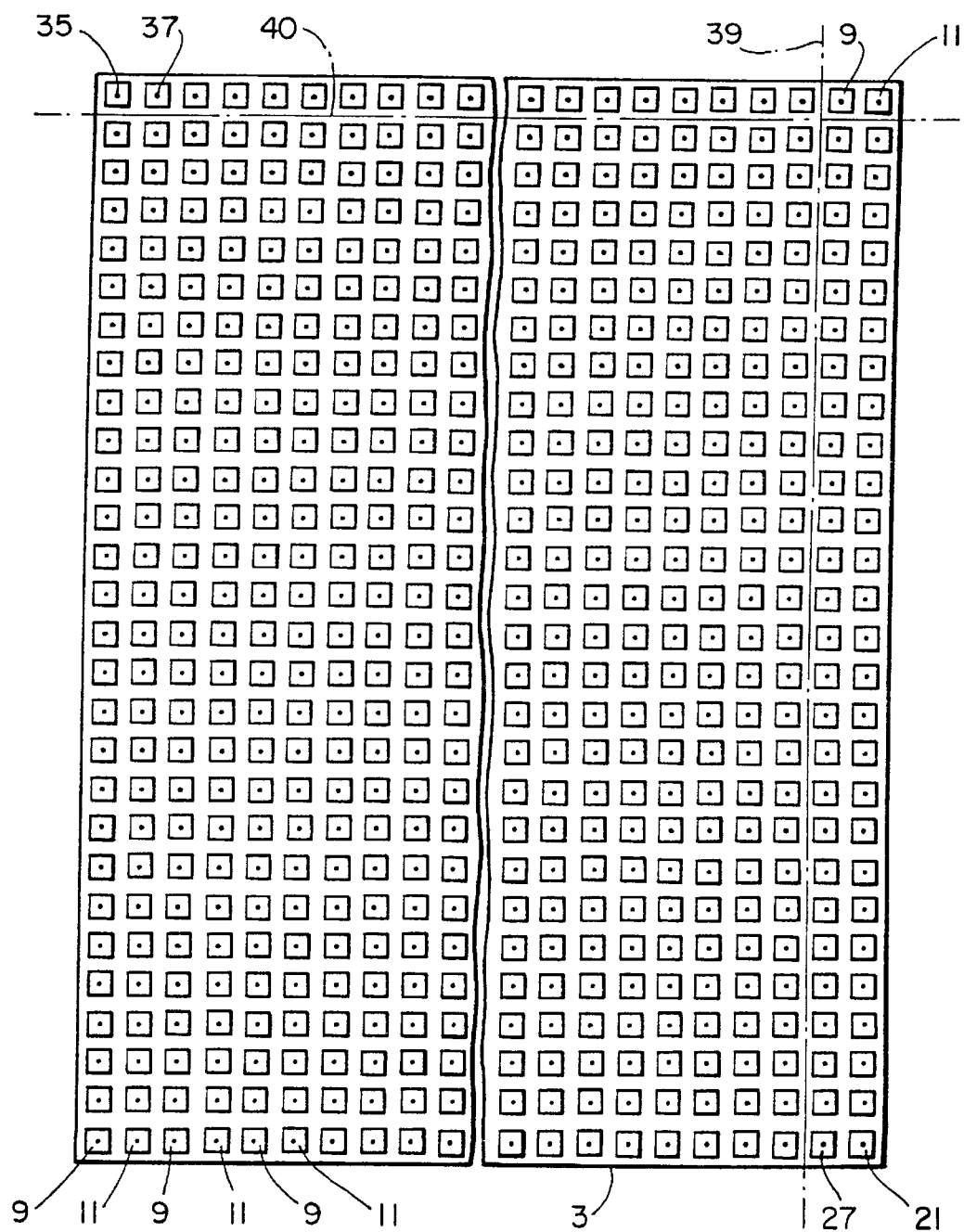
FIG_8

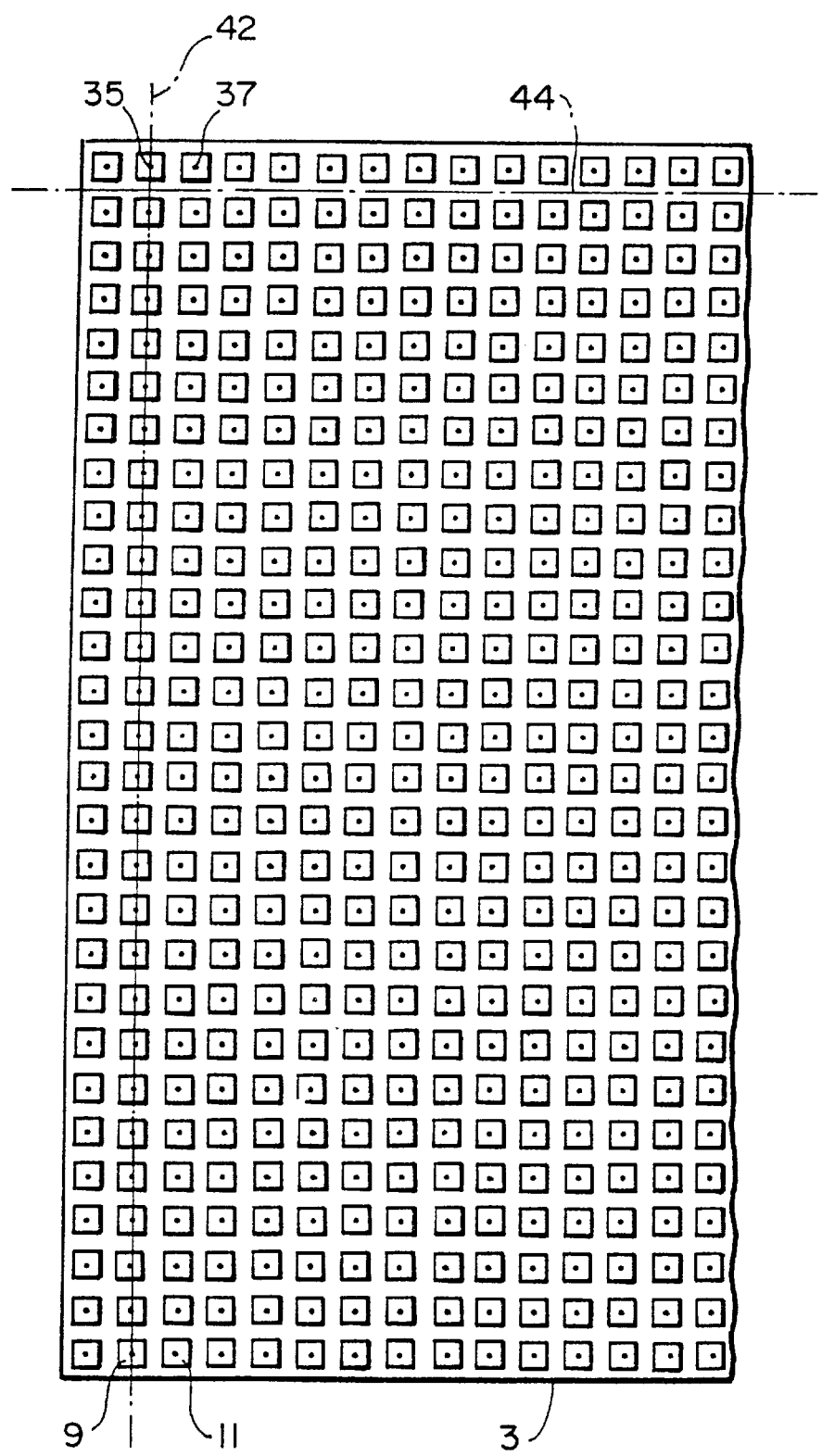
FIG_8A

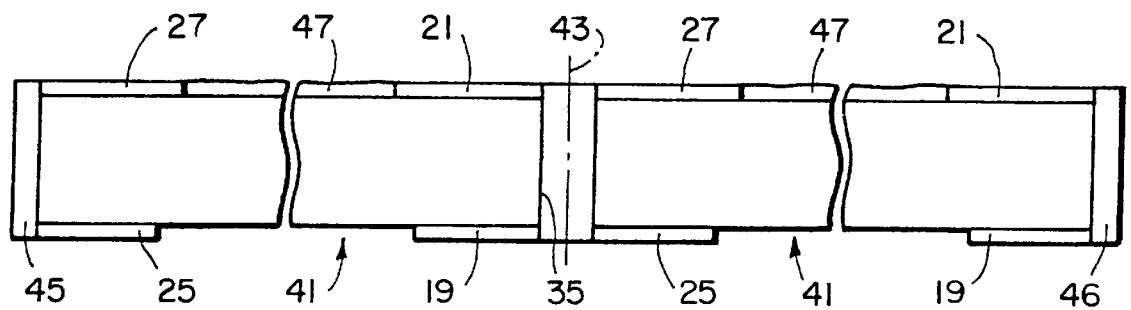
FIG_9
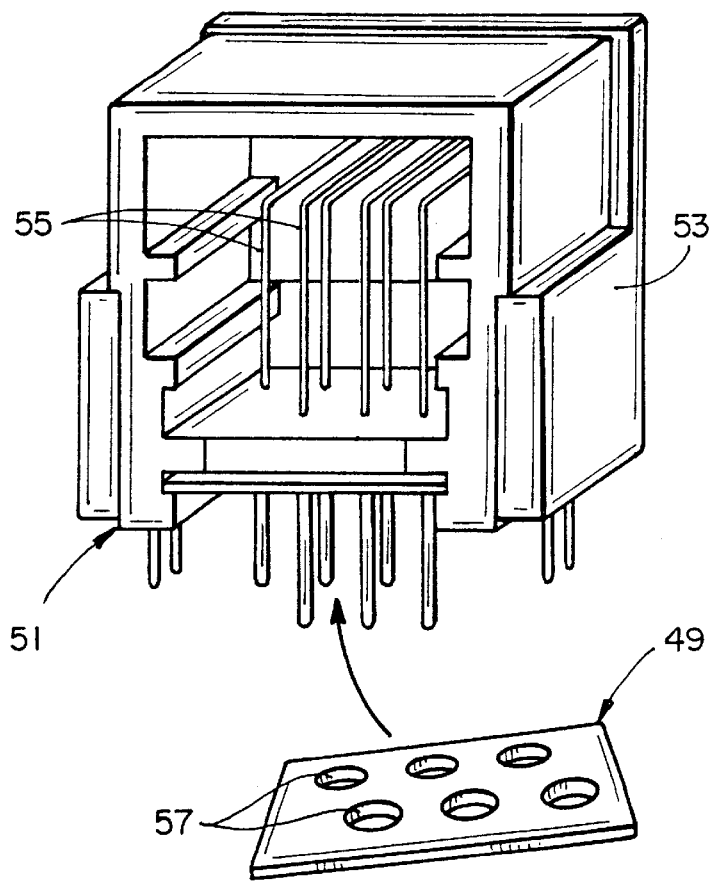
FIG_10

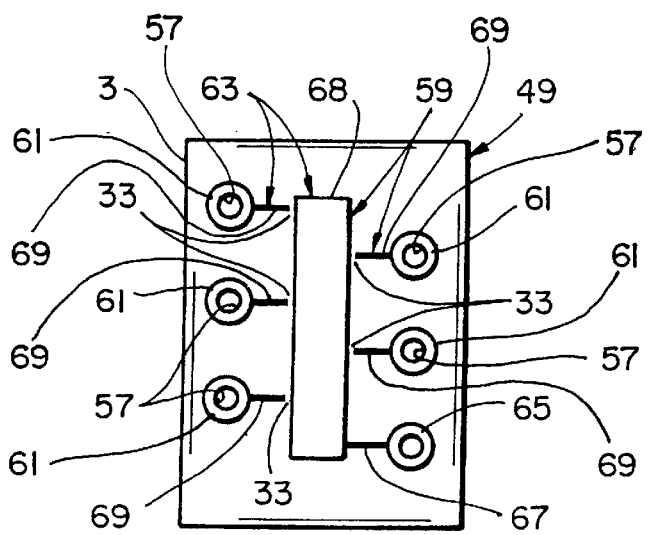
FIG_11
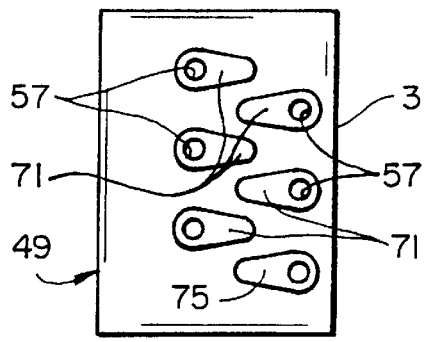
FIG_12
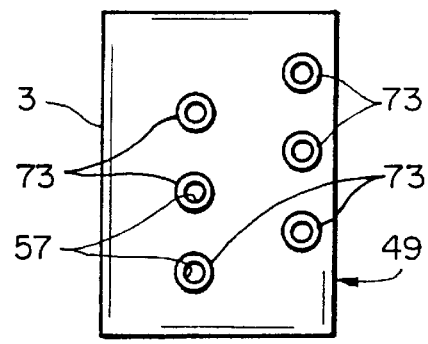
FIG_13
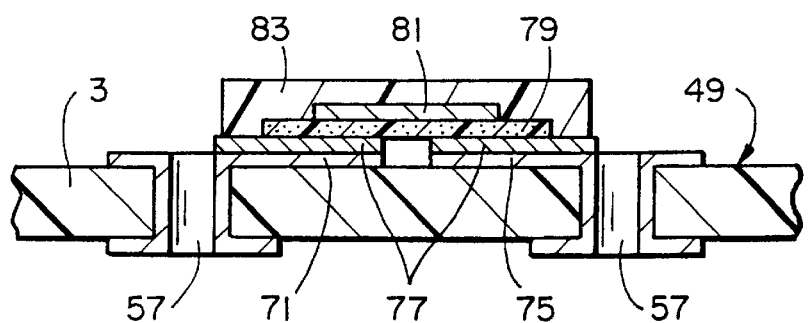
FIG_14

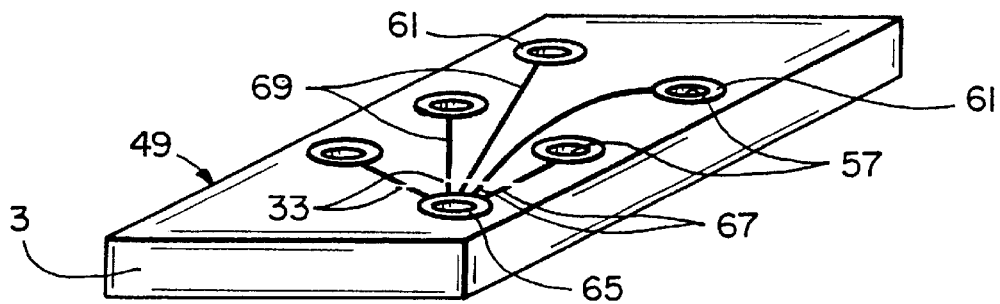
FIG_15
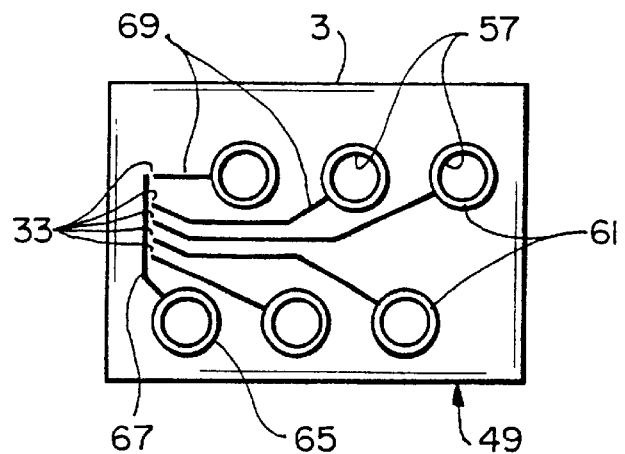
FIG_16
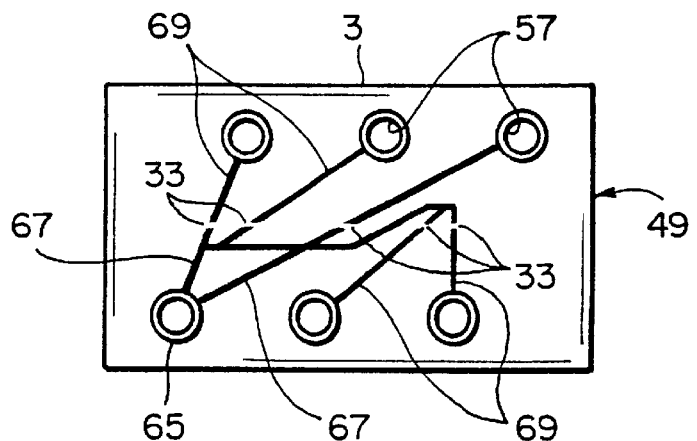
FIG_17

OVER-VOLTAGE PROTECTION DEVICE AND METHOD FOR MAKING SAME

This appln is a con't of Ser. No. 08/785,309 filed Jan. 21, 1997 now abandoned, which is a continuation of Ser. No. 08/589,355 filed Jan. 22, 1996 which was a Provisional of Ser. No. 60/034,839 filed Jan. 7, 1997.

FIELD OF THE INVENTION

The present invention relates generally to over-voltage protection devices used to protect electronic circuits from overvoltage transients caused by lightning, electromagnetic pulses, electrostatic discharges, ground loop induced transients, or inductive power surges. The present invention relates particularly to an electrical protection device capable of being mass produced cost-effectively and utilized as a discrete component.

BACKGROUND OF THE INVENTION

Voltage transients can induce very high currents and voltages that can penetrate electrical devices and damage them, either causing hardware damage such as semiconductor burnout, or electronic upset such as transmission loss or loss of stored data. The voltage transients produce large voltage spikes with high peak currents (i.e, over-voltage). The three basic over-voltage threats are electrostatic discharge, line transients, and lightning. However, electrostatic discharge can result from metallic instruments brought into near contact with devices, from vibrations created as the device moves along a conveyor or assembly line, or from being vibrated in a carrier. Electrostatic discharge occurs, for example, when static charge dissipates off the body of a person in direct physical contact with an operating electronic system or integrated circuit chip. Line transients are surges in AC power lines. Line transients can also occur due to closing a switch or starting a motor. Lightning strikes can strike stationary objects, such as a building, or mobile objects such as aircraft or missiles. Such strikes can suddenly overload a system's electronics. At peak power, each of these threats is capable of destroying the sensitive structure of an integrated circuit chip.

Various overvoltage protection materials have been used previously. These materials are also known as non-linear resistance materials and are herein referred to as such. In operation, the non-linear resistance material initially has high electrical resistance. When the circuit experiences an overvoltage spike, the non-linear resistance material quickly changes to a low electrical resistance state in order to short the overvoltage to a ground. After the overvoltage has passed, the material immediately reverts back to a high electrical resistance state. The key operational parameters of the non-linear resistance material are the response time, the clamp voltage, the peak current and the voltage peak. The time it takes for the non-linear resistance material to switch from insulating to conducting is the response time. The voltage at which the non-linear resistance material limits the voltage surge is called the clamp voltage. In other words, after the material switches to conducting, the material ensures that the integrated circuit chip, for example, will not be subjected to a voltage greater than the clamp voltage. The voltage at which the non-linear resistance material will switch (under surge conditions) from insulating to conducting is the trigger voltage. These materials typically comprise finely divided particles dispersed in an organic resin or insulating medium. For example, U.S. Pat. No. 4,977,357 (Shrier) and U.S. Pat. No. 4,726,991 (Hyatt et al.) disclose such materials.

Non-linear resistance materials and components containing non-linear resistance materials have been incorporated into overvoltage protection devices in a number of ways. For example, U.S. Pat. Nos. 5,142,263 and 5,189,387 (both issued to Childers et al.) disclose a surface mount device which includes a pair of conductive sheets and non-linear resistance material disposed between the pair of conductive sheets. U.S. Pat. No. 4,928,199 (Diaz et al.) discloses an integrated circuit chip package which comprises a lead frame, an integrated circuit chip protected by an electrode cover which is connected to ground on one side, and a variable voltage switching device including the non-linear resistance material connected to the electrode cover on the other side. U.S. Pat. No. 5,246,388 (Collins et al.) is directed to a device having a first set of electrical contacts that interconnect with signal contacts of an electrical connector, a second set of contacts that connect to a ground, and a rigid plastic housing holding the first and second set of contacts so that there is a precise spacing gap to be filled with the overvoltage material. U.S. Pat. No. 5,248,517 (Shrier et al.) discloses painting or printing the non-linear resistance material onto a substrate so that conformal coating with non-linear resistance material of large areas and intricate surfaces can be achieved. By directly printing the non-linear resistance material onto a substrate, the non-linear resistance material functions as a discreet device or as part of the associated circuitry.

It is commonly known in the art that the thickness of the non-linear resistance material and volume of the material are important to performance. See U.S. Pat. No. 4,977,357 issued to Shrier, U.S. Pat. No. 4,928,199 issued to Diaz et al. and U.S. Pat. No. 4,726,991 issued to Hyatt et al. Likewise, it is known that the clamp voltage is reduced or the non-linear resistance material can short out if put under pressure. See U.S. Pat. No. 5,248,517 issued to Shrier et al.

U.S. Pat. No. 5,262,754 (Collins) discloses an overvoltage protection element that can replace discrete devices presently used in protecting electronic circuits. The overvoltage protection element includes a layer of insulating material having first and second spaced major surfaces spaced a predetermined distance to determine the thickness of the element, a plurality of spaced holes extending between the major surfaces, and a overvoltage protection material contained within the holes formed in the layer of insulating material and extending between the spaced major surfaces. The spaced holes are formed by perforating the layer of insulating material by mechanical punching, laser processing and cutting, chemical etching, etc. The holes are formed in a pattern and should be wider than about one-half the width of the associated electrical circuit to which the holes will overlay. The spacing of the holes is determined by the spacing of the leads in the electrical circuit.

The above U.S. Patents referred to are incorporated herein by reference.

SUMMARY OF THE INVENTION

The present invention provides a mass-producible, cost-effective discrete electrical protection device that utilizes a small gap between two electrically conductive members attached to a substrate to provide over-voltage protection to an electrical device. In one aspect, the electrical protection device is a surface mountable device. In another aspect, the device has through-holes for accommodating leads on an electrical connector.

In one of its aspects, the present invention is an electrical protection device comprising a substrate having a first surface and a second surface, a first pad attached to the second surface of the substrate, a second pad spaced from the first pad and attached to the second surface of the substrate, a third pad attached to the first surface of the substrate and being in electrical communication with the first pad, a fourth pad spaced from the third pad and attached to the first surface of the substrate, the fourth pad being in electrical communication with the second pad.

In another of its aspects, the present invention is a method for making at least one electrical protection device, comprising the steps of providing an electrically insulating substrate having electrically conductive layers on opposite sides thereof, forming at least two through-holes in the electrically insulating substrate and the electrically conductive layers, forming electrically conductive paths between the electrically conductive layers through the through-holes, and forming electrically conductive pads around the through-holes, the electrically conductive pads being spaced from each other.

In another of its aspects, the present invention is a method for making at least one electrical protection device, comprising the steps of providing an electrically insulating substrate having electrically conductive layers on opposite sides thereof, forming at least two through-holes in the electrically insulating substrate and the electrically conductive layers, forming electrically conductive paths between the electrically conductive layers through the through-holes, forming electrically conductive pads around the through-holes, the electrically conductive pads being connected by a trace, and forming a gap in the trace.

BRIEF DESCRIPTION OF THE DRAWINGS

Many objects and advantages of the present invention will be apparent to those of ordinary skill in the art when this specification is read in conjunction with the attached drawings. The invention will now be described with reference to the accompanying drawings wherein like reference numerals are applied to like elements and wherein:

FIG. 1 is an exploded perspective view of one embodiment of the electrical protection device;

FIG. 2 is an elevational view of the electrical protection device of FIG. 1;

FIGS. 2A and 2B are elevational views of electrical protection devices for contacting a plurality of leads in accordance with the present invention;

FIG. 3 is a cross-sectional view taken along line 3—3 in FIG. 4 of another embodiment of the present invention;

FIG. 4 is a top plan view of the electrical protection device of FIG. 3;

FIG. 5 is a bottom plan view of the electrical protection device of FIG. 4;

FIG. 6 is a cross-sectional view of another embodiment of the electrical protection device;

FIG. 6A is a cross sectional view of yet another embodiment of the electrical protection device;

FIG. 7 is a front elevational view of a chip resistor made according to one embodiment of the present invention;

FIG. 8 is a plan view of an array of electrical protection devices produced in accordance with one embodiment of the present invention before being divided into discrete devices;

FIG. 8A is a plan view of an array of devices produced in accordance with antother embodiment before being divided into discrete devices;

FIG. 9 is a diagrammatic elevational enlarged view of a portion of the array of FIG. 8 illustrating one embodiment of producing the electrical protection device in accordance with the present invention;

FIG. 10 is an exploded perspective view of another embodiment of the electrical protection device of the present invention utilized in a RJ connector;

FIG. 11 is a top plan view of one embodiment of a circuit pattern used in the electrical protection device of FIG. 10;

FIG. 12 is a top plan view of another embodiment of the circuit pattern for an electrical protection device for use in FIG. 10;

FIG. 13 is a bottom plan view of the electrical circuit of FIG. 12;

FIG. 14 is a cross-sectional view of one embodiment of the electrical protection device for use in the electrical connector in FIG. 10; and FIGS. 15, 16 and 17 are other embodiments of the circuit pattern used in the connector of FIG. 10.

DETAILED DESCRIPTION OF THE PREFERRED EMBODIMENTS OF THE INVENTION

In one embodiment of the present invention, electrical protection device 1 (FIGS. 1 and 2) comprises a substrate 3 having ground pad 5 and pad 7 attached to a lower surface. Attached to the top of substrate 3 are conductive pads 9 and 11. Located on top of pad 9 is conductive element 13 and on top of pad 11 is non-linear resistance material 15. Pad 9 is in electrical communication with ground pad 5 through plated or filled via or through-hole 35. Likewise, pad 7 is in electrical communication with pad 11 through plated or filled via or through-hole 37. As one of ordinary skill in the art will recognize the conductive element 13 and the non-linear resistance material 15 can be switched and device 1 will operate the same. Device 1 of FIGS. 1 and 2 is a discrete, surface-mountable device that is attached to a printed circuit board or other device having leads or traces. The device 1 overlays exposed printed circuit leads such as a signal lead and a ground lead. An overvoltage spike in the signal lead immediately passes from pad 7 through through-hole 37 to pad 11, activates non-linear resistance material 15 and passes through ground plane 23 to conductive element 13 and on to the ground lead through pad 9, through-hole 35 and pad 5.

In one embodiment of the present invention, electrical protection device 1 is produced from separate layers of material laminated together. For example, substrate 3 is 0.03 inch thick bismaleimide triazine, fire retardant grade 4 laminate printed wiring board material, polyimide or high temperature epoxy. Substrate 3 typically is in large panels (e.g., 3 feet by 4 feet) such as shown in FIG. 8. Pads 5, 7, 9 and 11 are 1 ounce copper sheets that are stamped out of large sheets as well, like is generally done with lead frames. The conductive ground plane 23 can be any of a variety of electrically conductive materials known to one of ordinary skill in the art such as copper, nickel-plated copper, brass, beryllium copper, etc. Substrate 3 is prepared for lamination a in manner similar to the production of printed circuit boards and the copper sheets containing pads 5, 7, 9 and 11 are laminated to the substrate. A plurality of through-holes 35 and 37 are then made through the substrate 3 and copper sheets. The through-holes can be make by drilling, laser micromachining or other methods recognized by those of ordinary skill in the art. The size of the through-holes varies depending on design requirements. Typically, the through-hole diameter is 0.012 inches. The through-holes and outer surfaces of pads 9 and 11 are copper-plated with known techniques. The through-holes can also be filled instead of plated (e.g., conductive epoxy). Outer surfaces of pads 5 and 7 are gold-plated with standard techniques. Non-linear resistance material 15 is then applied to pad 11, for example, by screen-printing. A conductive epoxy, solder or other conductive material 13 is applied to pad 9. Then ground plane 23 is applied across the conductive material 13 and non-linear resistance material 15. As one of ordinary skill in the art will appreciate, the levelness of each of the materials and components of the device substantially improves the yield when producing the device. A passivation layer can be applied to the device 1 to protect it, as will be recognized by one of ordinary skill in the art, such as epoxy or standard molding compound. The plurality of devices 1 making up the large panel are then divided out of the large panel along cutting lines 39 and 40, for example, and repeated across and down the board to form a plurality of discrete, surface-mountable devices 1 for attachment to a ground lead and a signal lead of a device to be protected. In another embodiment, the panel can be divided into discrete devices having three or more conductive pads on each side of the substrate (FIG. 2A). In such an embodiment, any number of pads can have non-linear resistance material with only one ground pad. In another such embodiment, any number of pads can have non-linear resistance material with any number of ground pads (FIG. 2B). These devices can be used for application across multiple leads of a device to be protected. The device can be produced in any standard and non-standard package sizes.

In another embodiment of the present invention (FIG. 6), an electrical protection device 1 can be produced more cost-effectively by using fire retardant grade 4 laminate (as it is commonly referred to FR-4) comprising an electrically insulating substrate with copper foil layers on either side. The resulting electrical protection device 1 (FIG. 6) has the same resulting structure comprising pads 5, 7, 9 and 11, ground plane 23, conductive material 13, and non-linear resistance material 15 as shown in either FIGS. 2–2B. In the embodiment of FIG. 6, the pads 5, 7, 9 and 11 are produced by the standard photolithographic method of photo-resisting portions of the copper foil layers on each side of the large panel of FR-4 laminate. Imaging a pattern of pads on the surface of the copper layers. Developing and etching the pattern of pads into the copper layers. Then removing the photoresist. A plurality of devices are then produced by the same steps described previously. This embodiment eliminates the steps of laminating the copper sheets to the substrate as described previously. As one of ordinary skill will recognize, other methods of producing the pads can be used particularly when very small dimensions are needed for the size of the pads and the resulting device 1. For example, ultra-violet laser projection imaging, x-ray and electron-beam lithography can be used. In the embodiment shown in FIG. 6, the through-holes are shown copper-filled with, for example, conductive epoxy but as one of ordinary skill in the art will recognize, the through-holes can be plated. In another embodiment, a plurality of devices making up the large panel are then divided out of the large panel along cutting lines 42,44 (FIG. 8A), for example, and repeated across and down the board to form a plurality of discrete surface mountable devices (FIG. 6A). This embodiment has particular cost-saving and manufacturing advantages in that fifty percent fewer holes need to be made in the panel. As before, the device is not liminted to only two pads on the top and bottom. The device can comprise mulitple pads (signal or ground) for application to multiple leads.

The manufacturing advantages achieved with using and dividing the FR-4 laminate as described above can be applied to produce another embodiment of the present invention (FIGS. 3–5). In this embodiment, an electrical protection device 1 is comprised of substrate 3 having pad 19, pad 21, ground pad 25 and pad 27. Pad 21 and pad 27 have extensions 29 and 31, respectively. A precisely spaced gap or space 33 exists between extensions 29 and 31.

As shown in FIGS. 3 and 4 the gap 33 is filled with non-linear resistance material 15. However, the gap could be filled with a vacuum (in that case, it would be capped), air (in that case, it may be covered with tape or capped for protection from the environment) or any dielectric such as will impede the flow of electrical current from extension 29 to 31 until there is an over-voltage condition. The non-linear resistance characteristics of the electrical protection device 1 are determined by the non-linear resistance material used and/or the width of gap 33. The wider the gap the higher the clamp voltage. If a clamp voltage between about 20 to 30 volts is desired a typical width for the gap 33 would be 0.8 to 1.0 mils. If a clamp voltage between about 30 to 40 volts is desired a typical width would be 1.0 to 2.0 mils. If a clamp voltage between 40 to 70 volts is desired a typical width would be 2.0 to 3.0 mils.

In another embodiment of the invention which comprises as the variable voltage protection material a thin layer of a neat dielectric polymer, glass, ceramic or composites thereof, it has been found that an electrical protection device is surprisingly effective at a desired range of clamping voltages provided that the layer of neat dielectric polymer, glass, ceramic or composites thereof is sufficiently thin. It has been found that for some polymers a gap of less than about 0.8 mil will provide effective overvoltage protection under various conditions, while for other polymers a gap of less than about 1.6 mils provides the desired performance characteristics. It is preferable in many applications that the gap be less than about 0.5 mil and more preferably less than about 0.2 mil. Similarly, when the gap is filled with a glass layer it is preferred that the gap be less than about 0.8 mil, but for some glasses in certain applications a thickness of up to about 3.8 mils is appropriate. As will be appreciated by one skilled in the art, the actual thickness of the neas dielectric polymer, glass, ceramic or composites thereof layer employed in a particular over-voltage protection function will vary depending on the type of polymer or glass used, the operating conditions of the device in which the variable voltage protection element is employed and the performance properties required of the protection device.

As used in the disclosure and description of the present invention, the term "neat dielectric polymer, glass, ceramic or composites thereof" refers to a polymeric, glass, ceramic or composite thereof material which can act as a dielectric or insulating material under the normal voltage and current conditions of intended use and which is unfilled, i.e., does not contain conductive or semiconductive particles such as those typically used in binders or otherwise associated with variable voltage protection materials of the prior art. However, "neat dielectric polymer, glass, ceramic or composites thereof" is intended to include polymeric, glass, ceramic or composites thereof materials which fulfill the above criteria, but which may contain or have added to them insulative or inert particles or materials that are inactive or do not interfere with the desired dielectric/over-voltage protection properties of the polymer or glass layer as used in the present invention.

The polymers and glasses useful in this aspect of the invention can be selected from polymers known in the art to be useful as binders in conventional non-linear resistance materials to the extent that such polymers are known to have high resistance to tracking and high resistance to arcing. In addition, other polymers and glasses not previously suitable for or used as such binders are also useful in the present invention if they exhibit sufficient dielectric properties, sufficient resistance to tracking and sufficient resistance to arcing under the operating conditions selected for a device according to this invention.

In general, the types of polymers useful in the present invention include silicone rubber and elastomer, natural rubber, organopolysiloxane, polyethylene, polypropylene, polystyrene, poly(methyl methacrylate), polyacrylonitrile, polyacetal, polycarbonate, polyamide, polyester, phenol-formaldehyde resin, epoxy resin, alkyd resin, polyurethane, polyamide, phenoxy resin, polysulfide resin, polyphenylene oxide resin, polyvinyl chloride, fluoropolymer and chlorofluoropolymer. These and other useful polymers can be used by themselves or can include various substituent groups and can be mixtures, blends or copolymers thereof, wherein the final polymer is selected in accordance with the criteria described above. A particularly preferred polymer is a conventional and commercially available General Electric "615" silicone, and it is also particularly preferred to cure this polymer for about 15 minutes at about 200° C. to obtain properties better suited for use in this invention. It has been found that this polymer provides good performance in a thickness of about 0.2 mil. Another form of polymer useful in this invention is woven or nonwoven polymer fibers compressed into a mat of desired thickness. For example, a polymer fiber material useful in the present invention is a layer of nonwoven aramid (aromatic polyamide) fibers, commercially available as "KEVLAR" or "NOMEX" nonwoven fiber mat from E.I. Du Pont de Nemours & Company. The nonwoven aramid fiber mat of about 1.6 mils has been found to provide good performance when compressed to a thickness of 0.8 mils.

The glass materials useful in this invention are likewise glass materials which have been used as binders in variable voltage materials such as sodium silicate. The dielectric glass, such as a sodium silicate is generally useful in this invention in thicknesses similar to those outlined above for the polymer materials. Further, glass fibers can be used to form the dielectric glass in accordance with this invention.

As will be appreciated by one skilled in the art, various dielectric polymers and glasses can be used in this invention following the teachings contained herein with respect to the gap that must be maintained for the neas dielectric polymer, glass, ceramic or composites thereof to exhibit the desired clamping voltage and other desired properties. Examples of polymers which can be employed in this invention include, those disclosed in U.S. Pat. Nos. 4,298,416, 4,483,973, 4,499,234, 4,514,529, 4,523,001, 4,554,338, 4,563,498, 4,580,794, the disclosures of which are incorporated herein by reference. As indicated, other resins may be selected for use in accordance with this invention.

In another aspect of this invention, it has been found that the above described neat dielectric polymer, glass, ceramic or composites thereof layer can be used in combination with a non-linear resistance material to modify and enhance certain properties and performance characteristics of the non-linear resistance. As referred to as part of this invention, the non-linear resistance material can be a conventional variable voltage material which comprises a binder containing conductive particles and/or semiconductive particles and/or insulative particles. As used in this invention, the non-linear resistance material may also include other novel, modified and improved non-linear resistance materials or over-voltage components such as disclosed in this specification and as disclosed in commonly assigned U.S. application Ser. No. 08/275,947 filed on Jul. 14, 1994 with U.S. application Ser. No. 08/275,174.

The non-linear resistance material 5 used in accordance with the present invention can be any non-linear resistance material known in the art, for example those disclosed in either U.S. Pat. No. 4,977,357 (Shrier) or U.S. Pat. No. 4,726,991 (Hyatt et al.), which are incorporated herein by reference. Generally, the non-linear resistance material comprises a binder and closely spaced conductive particles homogeneously distributed in the binder and spaced to provide electrical conduction. In addition, various material such as that disclosed in U.S. Pat. No. 4,103,274 (Burgess et al.) can be used in accordance with the present invention.

The electrical protection device 1 and gap 33 (as shown in FIGS. 3–5) can be formed in many ways such as, beginning with a commercially available FR-4 laminate printed wiring board material in a large panel as discussed previously and using the standard techniques discussed above to etch the pads 21 and 27 with extension 29 and 31 respectively into the copper layer leaving gap 33. In another embodiment, the pads, extension and resulting gap can be formed by applying a layer of liquid photo-resist over the copper layer on the upper surface of the substrate 3. Imaging a pattern in the liquid resist so as to leave a small area of liquid resist to form a gap 33 and a pattern for the pads and extensions. Electrolytically forming a nickel trace over the imaged pattern area to form a nickel coating (not shown) over the pads 21, 27 and extensions 29 and 31. Removing the liquid resist from the copper so as to form gap 33 between the nickel coating over each extension 29 and 31. Then etching gap 33 in the upper copper layer of the laminate below the gap already formed in the electrically formed nickel coating. The nickel coating (not shown) is optional. The advantage of the nickel is that is provides an oxidation resistant surface on the inside of the gap which prevents metallic migration shorting between the extensions across the gap. The nickel also provides a more solderable surface that the copper. Liquid resist is preferable because it allows for fine image resolution in the micron dimension range, however, for some gaps (e.g., in the 3 micron size) an electron beam can be used to image the resist. For the embodiment utilizing the nickel coating, typically the copper layer is ⅛ to ¼ ounce and the nickel coating thickness is 250 microinches.

In another embodiment, the gap and pads are formed by applying a dry film resist layer over the top layer of copper. Using standard resist imaging to form an open area in the resist without a small area of liquid resist to form a gap as was done in the previous embodiment. Electrolytically forming a nickel coating (not shown) in the open area with no gap present. Removing the resist from the copper layer leaving a nickel coating. Laser notching a gap in the electrolytically formed nickel coating. Then photo-etching gap 33 in the upper copper layer of the FR-4 laminate below the gap already formed in the nickel coating. As before, the nickel coating (not shown) is optional.

In another embodiment, the method just described is used except that instead of only laser notching through the nickel-coating, the laser is used to notch through the nickel coating and copper layer on the FR-4 substrate. In this embodiment, preferably the nickel-coating is at least 100 microinches thick in order to compensate for slight taper in the gap. In addition, post-etching of the copper layer might be required in order to compensate for differential gap width between the nickel layer and the width of the gap at the bottom of the gap in the copper layer. This can be accomplished with, for example, an ultraviolet mask protection step and repeat process.

In another embodiment, the copper layer on the FR-4 substrate can be etched with conventional techniques to form pads 19 and 25 on the bottom of the substrate 3 and pads 21 and 27 having their respective extensions 29 and 31 joined. Then, the gap 33 can be cut through the upper copper layer to separate the extensions.

There are generally three laser options: $CO_2$-based lasers with typical wavelengths of 10.6 μm; ultraviolet excimer lasers with typical wavelengths of approximately 200 to 350 nm; and Nd:YAG lasers operating at a wavelength of 266 nm. Preferably, the laser notching is accomplished using an ultraviolet excimer laser.

In another embodiment, a chip resistor 41 as shown in FIG. 7 can be produced with a similar manufacturing method as described previously. An FR-4 laminate 3 or another substrate consisting of an aluminum oxide body and conductive layers on the top and bottom thereof can be used to form chip resistor 41 or form other electrical protection devices such as shown in FIG. 3. As discussed previously, the laminate substrate comes in large panels shown in FIG. 8. A plurality of through-holes 35, 37 are formed in substrate 3 as shown in FIG. 8 and either plated or filled with conductive material. Instead of dividing laminate 3 along lines 39 and 40 as discussed previously, the laminate 3, in this embodiment, is divided along line 43 through the through-holes 35 (as shown in FIG. 9) and 37 to produce a chip resistor 41 having metallization 45 and 46 around the ends as shown in FIG. 7. Metallization 45 puts pads 25 and 27 in electrical communication and metallization 46 puts pads 21 and 19 in electrical communication. Resistive ink or thin film 47 is placed between the pads prior to dicing. As one of ordinary skill in the art will appreciate, the devices described with respect to FIGS. 3–6A can also be divided through the through-holes to have metallization on the ends. Likewise, the chip resistor of FIG. 7 can be divided along dividing lines 39 and 40 so as to have metallization in the through-holes instead of around the ends.

In another embodiment, the manufacturing steps described previously of producing and dividing a plurality of discrete devices out of a large panel can be used to produce a through-hole electrical protection device 49 for use with any of a variety of electrical connectors, for example, a RJ (i.e., telephone) connector 51, D-Sub connector (i.e., multiple pin computer cable connectors), etc. The electrical protection device 49 is essentially the same in all of the electrical connectors except for variations in the shape/size and circuit pattern as described below. For each connector, the design of the device 49 will be essentially the same in that when the device is installed in the connector there will be at least one connector pin passing through a through-hole in the device, at least one ground pin passing through at least one ground through-hole in the device, and the ground through-hole(s) in the device will be electrically isolated from the other through-hole(s) until an over-voltage condition is experienced. Therefore, only the RJ connector 51 and corresponding embodiments for a through-hole electrical protection device 49 will be described for illustrative purposes.

The RJ electrical connector 51 (FIG. 10) is comprised of insulating housing 53 having a mating connector opening (not shown) for receiving a mating connector, such as a telephone jack. The insulating housing 53 also has a plurality of electrical leads 55 (e.g, six, at least one of which is a ground lead) extending from the insulating housing 53. The electrical protection device 49 is placed in the connector 53 by inserting the leads 55 through-holes 57 with the ground lead of the connector corresponding to the ground through-hole of the device 49. In one embodiment, the device is then soldered to the leads of the connector. Any overvoltage spikes which enter the electrical connector 51 through any of the leads 55 is immediately passed through the device 49 to the ground lead to be shunted off to ground.

The through-holes 57 can be made by drilling, laser micromachining or other methods recognized by those of ordinary skill in the art. The size of the through-holes varies depending on the diameter of the leads extending from the particular connector. For example, the through-hole hole diameter can range from 2 mils to 30 mils, but more typically are 12 mils in diameter.

FIGS. 11–17 illustrate possible embodiments for electrical protection device 49. Each of these embodiments can be manufactured using the processes describe above, as well as other processes known by those of ordinary skill in the art. For example, the metallization patterns can be etched in the copper layers on a FR-4 laminate and the gaps 33 can be laser-etched in selected traces in the metallization patterns. The embodiments shown in FIGS. 11–13 and 15–17 are shown without an outer protective coating, such as a passivation layer, but as will be recognized by one of ordinary skill in the art a protective coating such as epoxy or molding compound can be applied to these embodiments to protect the device.

In the embodiment shown in FIG. 11, a metallization pattern 59 is shown comprised of a plurality of pads 61 (corresponding to the number of through-holes 57 in the substrate 3) and a plurality of traces 63. Each of the pads 61 shown on the top of the substrate 3 is connected to a corresponding pad on the bottom of the substrate by metallization in the through-holes 57. Pad 65 is designated the ground. In this particular embodiment, trace 67 extends out from the pad 65 and then a portion 68 extends along the length of the substrate 3 between each of the pads 61. A trace 69 extends from each of the pads 61 toward the portion 68 of trace 67. A gap 33 exists between the distal end of each trace 69 and portion 68 of trace 67. In this way, the electrical protection device 49 operates as discussed above by electrically isolating the leads attached to pads 61 from the lead attached to pad 65 until an over-voltage situation is encountered.

In another embodiment, traces 69 can be eliminated. In such an embodiment, a layer of non-linear resistance material is applied to portion 68 of trace 67 and an electrical connection is made between the top of the layer of non-linear resistance material and each of the pads 61 (e.g., by evaporating copper onto the device to form a connection from the pads to the non-linear resistance material or applying a conductive epoxy that extends from each pad 61 to the non-linear resistance material).

Other embodiments for the metallization pattern 59 include, but are not limited to, the embodiments shown in FIGS. 15–17. In addition, it will be recognized that the metallization patterns can be changed to accommodate more than one ground lead by extending another one of the traces to the metallization attached to the designated ground. Likewise, the gaps 33 can be filled with polymer, polymer-metal composite, glass, ceramic, polymer-glass composite, polymer-ceramic composite, air, gas (in which case it would be capped), dielectric, non-linear resistance material, etc. as discussed previously.

In the embodiment shown in FIGS. 12–13, pads 61 and corresponding traces 63 are formed as tear-drop shaped pads 71. Pads 71 on the upper surface of device 49 are connected to corresponding pads 73 on the bottom of the substrate 3 by metallization in the through-holes 57. Pad 75 is designated the ground. In this particular embodiment, non-linear resistance material 15 is applied to each of the pads 71 and conductive material 13 is applied to pad 75. As discussed previously with respect to the surface-mountable devices, the conductive material 13 can be applied to each of the pads 71 and the non-linear resistance material can be applied to pad 75. A ground bar (not shown) can then be attached across each of the patches of non-linear resistance material 15 and the conductive material 13. In the embodiment shown in FIG. 14, an addition nickel coating 77 can be formed (as described above) on each of the conductive pads 71 and 75. A layer 79 of non-linear resistance material is applied down the pattern of pads to connect each of the nickel coated patches on the pads, then a ground plane 81 is attached to the layer 79 of non-linear resistance material. Conductive epoxy (or other conductive material) is used to connect pad 75 to the ground plane 81. A coating 83 (i.e., passivation layer) can be applied for protecting the device.

The foregoing has described the principles, preferred embodiments and modes of operation of the present invention. However, the invention should not be construed as being limited to the particular embodiments discussed. Thus, the above-described embodiments should be regarded as illustrative rather an restrictive, and it should be appreciated that variations and different combinations may be made in and with those embodiments by workers skilled in the art by following the overall teachings of the entire disclosure without departing from the scope of the present invention as defined by the following claims.

What is claimed is:

1. An electrical protection device comprising:
   a substrate having a first surface and a second surface;
   a first pad attached to the second surface of the substrate;
   a second pad spaced from the first pad and attached to the second surface of the substrate;
   a third pad attached to the first surface of the substrate and being in electrical communication with the first pad;
   a fourth pad spaced from the third pad by a gap and attached to the first surface of the substrate, the fourth pad being in electrical communication with the second pad,
   wherein the gap operates to substantially electrically isolate the fourth pad from the third pad except in the presence of an overvoltage event.

2. The electrical protection device of claim 1, wherein the space between the third pad and the fourth pad is 3.0 mils or less.

3. The electrical protection device of claim 1, wherein the space between the third pad and the fourth pad is 12 microns or less.

4. The electrical protection device of claim 1, wherein the space between the third pad and the fourth pad is in a range not greater than 3.0 mils and not less than 3 microns.

5. The electrical protection device of claim 1 further comprising a non-linear dielectric in the space between the third pad and the fourth pad.

6. The electrical protection device of claim 1 further comprising an non-linear resistance material in the space between the third pad and the fourth pad.

7. The electrical protection device of claim 6 further comprising a passivation layer extending over the non-linear resistance material and at least a portion of the third pad and the fourth pad.

8. An electrical protection device comprising:
   a substrate having a first surface and a second surface;
   a first pad attached to the second surface of the substrate;
   a second pad spaced from the first pad and attached to the second surface of the substrate;
   a third pad attached to the first surface of the substrate and being in electrical communication with the first pad; and
   a fourth pad spaced from the third pad by a gap and attached to the first surface of the substrate, the fourth pad being in electrical communication with the second pad,
   wherein the gap operates to substantially electrically isolate the fourth pad from the third pad except in the presence of an overvoltage event; and
   wherein the electrical communications between the first pad and the third pad and the second pad and the fourth pad are through-holes in the substrate.

9. The electrical protection device of claim 8 wherein the through-holes are filled.

10. The electrical protection device of claim 8 wherein the substrate is an electrically insulating material from the group consisting of aluminum oxide, fire retardant grade 4 laminate, polyimide, bismaleimide triazine, high temperature epoxy or polyester.

11. The electrical protection device of claim 8 wherein the through-holes are plated.

12. The electrical protection device of claim 11 further comprising:
    a trace extending from the fourth pad toward the third pad, a distal end of the trace being spaced from the third pad.

13. The electrical protection device of claim 12, wherein the space between the distal end of the trace and the third pad is 3.0 mils or less.

14. The electrical protection device of claim 12, wherein the space between the third pad and the distal end of the trace is 12 microns or less.

15. The electrical protection device of claim 11 further comprising:
    a first trace extending from the third pad;
    a second trace extending from the fourth pad, a distal end of the second trace being spaced from the first trace.

16. The electrical protection device of claim 15, wherein the space between the first trace and the distal end of the second trace is in a range not greater than 3.0 mils and not less than 3 microns.

17. The electrical protection device of claim 15 further comprising a non-linear resistance material in the space between the first trace and the distal end of the second trace.

18. A method for making at least one electrical protection device, comprising the steps of:
    providing an electrically insulating substrate having electrically conductive layers on opposite sides thereof;
    forming at least two through-holes in the electrically insulating substrate and the electrically conductive layers;
    forming electrically conductive paths between the electrically conductive layers through the through-holes; and
    forming electrically conductive pads around the through-holes, the electrically conductive pads being spaced from each other by at least one gap which operates to substantially electrically isolate a pair of conductive pads from each other except in the presence of an overvoltage event.

19. The method of claim 18 further comprising filling the space between the electrically conductive pads on one side of the electrically insulating substrate with a non-linear resistance material.

20. The method of claim 18 further comprising filling the space between the electrically conductive pads on one side of the electrically insulating substrate with a dielectric.

21. The method of claim 20 further comprising dividing the electrically insulating substrate having electrically conductive pads thereon into discrete devices having at least two electrically conductive paths between the electrically conductive layers.

22. The method of claim 21 wherein the electrically insulating substrate having electrically conductive pads thereon is divided between two adjacent through-holes.

23. A method for making at least one electrical protection device, comprising the steps of:

providing an electrically insulating substrate having electrically conductive layers on opposite sides thereof;

forming at least two through-holes in the electrically insulating substrate and the electrically conductive layers;

forming electrically conductive paths between the electrically conductive layers through the through-holes;

forming electrically conductive pads around the through-holes, the electrically conductive pads being connected by a trace; and forming a gap in the trace, said gap operating to substantially electrically isolate a first portion of the trace from a second portion of the trace except in the presence of an overvoltage event.

24. The method of claim 23 wherein the gap is formed in the trace with a laser to produce a gap in a range not greater than 3.0 mils and not less than 3 microns.

25. The method of claim 23 further comprising filling the gap with a dielectric.

26. The method of claim 23 further comprising filling the gap with a non-linear resistance material.

27. The method of claim 23 further comprising forming a passivation layer over at least one side of the electrically insulating substrate having the trace thereon.

28. The method of claim 23 further comprising dividing the electrically insulating substrate having electrically conductive pads thereon into discrete devices having at least two electrically conductive paths between the electrically conductive layers.

29. The method of claim 23 further comprising forming a ground bar wherein the gap is formed in at least one trace connected to the ground bar.

30. The method of claim 29, wherein the gap is formed in the trace with a laser to a dimension in a range not greater than 3.0 mils and not less than 3 microns.

31. The method of claim 29 further comprising filling the gap with a dielectric.

32. The method of claim 29 further comprising filling the gap with a non-linear resistance material.

33. The method of claim 29 further comprising forming a passivation layer over at least one side of the electrically insulating substrate having the trace thereon.

34. The method of claim 29 further comprising dividing the electrically insulating substrate having electrically conductive pads thereon into discrete devices having at least two electrically conductive paths between the electrically conductive layers.

* * * * *